(12) United States Patent
Vaillant

(10) Patent No.: US 8,149,322 B2
(45) Date of Patent: Apr. 3, 2012

(54) IMAGE SENSOR WITH AN IMPROVED SENSITIVITY

(75) Inventor: Jérôme Vaillant, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 453 days.

(21) Appl. No.: 12/413,267

(22) Filed: Mar. 27, 2009

(65) Prior Publication Data

US 2009/0244347 A1  Oct. 1, 2009

(30) Foreign Application Priority Data

Mar. 28, 2008 (FR) ..................................... 08 52017

(51) Int. Cl.
- *H04N 5/225* (2006.01)
- *G02B 13/16* (2006.01)
- *H01L 31/0232* (2006.01)

(52) U.S. Cl. ......................... 348/340; 348/335; 257/432

(58) Field of Classification Search ............... 250/208.1; 257/432; 348/335, 340, 373, 374, 376; 359/619, 359/620, 626; 438/69, 70
See application file for complete search history.

(56) References Cited

U.S. PATENT DOCUMENTS

| | | | |
|---|---|---|---|
| 7,723,765 B2 * | 5/2010 | Park ............................... | 257/292 |
| 2003/0063210 A1 | 4/2003 | Tsuboi | |
| 2003/0215967 A1 | 11/2003 | Shizukuishi | |
| 2006/0028569 A1 | 2/2006 | Sekine | |
| 2006/0044449 A1 | 3/2006 | Sakoh | |
| 2006/0169870 A1 | 8/2006 | Silsby et al. | |
| 2007/0215912 A1 | 9/2007 | Kido et al. | |
| 2009/0305453 A1 * | 12/2009 | Yang et al. ...................... | 438/70 |

FOREIGN PATENT DOCUMENTS

JP  2003209230 A  7/2003

OTHER PUBLICATIONS

French Search Report dated Nov. 11, 2008 from French Patent application No. 08/52017.

\* cited by examiner

*Primary Examiner* — David N Spector

(74) *Attorney, Agent, or Firm* — Wolf, Greenfield & Sacks, P.C.

(57) ABSTRACT

An image sensor having a surface intended to be illuminated and pixels, each pixel including a photosensitive area formed in an active area of the substrate, at least one first pixel including a first microlens located on the surface, the sensor including at least one second pixel including a transparent portion forming a pedestal located at least partly on the surface and a second microlens at least partially covering the pedestal.

28 Claims, 3 Drawing Sheets

IMAGE SENSOR WITH AN IMPROVED SENSITIVITY

CROSS REFERENCE TO RELATED APPLICATIONS

This application claims the priority benefit of French patent application number 08/52017, filed on Mar. 28, 2008, entitled "IMAGE SENSOR WITH AN IMPROVED SENSITIVITY," which is hereby incorporated by reference to the maximum extent allowable by law.

BACKGROUND OF THE INVENTION

1. Field of the Invention

The present invention relates to an image sensor comprising an array of photosensitive cells, or pixels, arranged in rows and/or in columns and obtained in a CMOS-type technology. Such an image sensor or photodetector is intended to be used in image shooting devices such as, for example, cameras, cell phones, or digital photographic cameras.

2. Discussion of the Related Art

FIG. 1 is a cross-section view of a pixel (Pix) of an image sensor formed in and on a substrate 7, for example, silicon. The pixel is associated with a portion of surface 8 of substrate 7 which, in top view, generally has the shape of a square or of a rectangle. The pixel comprises a photosensitive active area PH generally corresponding to a photodiode capable of storing a quantity of electric charges according to the received light intensity. Photosensitive area PH is generally located at the center of the portion of surface 8 associated with the pixel. Substrate 7 is covered with a stack of transparent insulating layers 9, 11, 12, 13 which may be, as an example, alternately silicon oxide and silicon nitride. Conductive tracks 14, formed between insulating layers 9 and 11, and conductive vias 16, formed in insulating layer 9, especially enable addressing photosensitive area PH and collecting electric signals provided by photosensitive area PH. Conductive tracks 14 and conductive vias 16 are generally metallic. As an example, aluminum, tungsten, copper, and metal alloys may be mentioned. Such materials are opaque and possibly reflective. Conductive tracks and vias may be provided at the level of insulating layers 11, 12, 13. In a color sensor, a color filter element 17, for example, an organic filter, is arranged on the stack of insulating layers 9, 11, 12, 13 in line with the pixel. Color filter elements 17 are generally covered with a planarized equalization layer 18 which defines an exposure surface 19 exposed to light.

Photosensitive area PH generally does not extend over the entire portion of surface 8 of substrate 7 associated with a pixel. Indeed, a portion of this surface is dedicated to devices for addressing photosensitive area PH and reading from it, not shown in FIG. 1, and which for example comprise MOS transistors. To redirect the maximum amount of light which reaches the portion of exposure surface 19 associated with the pixel towards photosensitive area PH, a microlens 21, of optical axis Δ, is arranged on equalization layer 18, opposite to photosensitive area PH to focus the light rays towards photosensitive area PH. As an example, the travels of two light rays R1, R2 are schematically shown in FIG. 1. Conductive track 14 and conductive vias 16 are arranged to avoid hindering the passing of the light rays. Microlens 21 is for example obtained by covering equalization layer 18 with a resin. The resin is etched to delimit distinct resin blocks. The resin blocks are then heated. Each resin block then tends to deform by flowing to obtain a convex external surface 22. The flow step is followed by a microlens reticulation step. To direct the maximum amount of light towards photosensitive area PH, microlens 21 generally has a square or rectangular base which practically takes up the entire portion of exposure surface 19 associated with the pixel.

For applications such as mobile telephony, the present tendency is to decrease the dimensions of pixels to be able to integrate a greater number thereof on a same surface of a substrate. To limit the decrease in the dimensions of photosensitive area PH, it is desired to pool at least part of the addressing and reading devices, for example, MOS transistors, between adjacent pixels. To pool MOS transistors between adjacent pixels, it may be necessary not to form photosensitive areas PH at the center of pixels. Thereby, the center of photosensitive area PH is offset with respect to optical axis Δ of microlens 21.

There then is a risk that only part of the light focused by microlens 21 will be received by photosensitive area PH. The image sensor sensitivity may then decrease. Further, since the position of photosensitive area PH with respect to the center of a pixel can vary from one pixel to the other, two pixels illuminated in the same way may provide different signals, given that their photosensitive area does not receive the same amount of light. Further, since the position of photosensitive area PH with respect to the center of a pixel may vary from one pixel to the other, it is not possible to offset each microlens 21 to align it back on the corresponding photosensitive area PH, short of forming partially overlapping lenses or of decreasing the dimensions of microlenses 21. However, decreasing the dimensions of microlenses 21 means that part of the light reaching exposure surface 19 will not be directed towards photosensitive areas PH, thus resulting is a sensitivity loss of the sensor.

SUMMARY OF THE INVENTION

The present invention aims at an image sensor formed of a pixel array where, at least for some pixels, the photosensitive area is not located at the center of the pixel and which enables redirecting a more significant part of the light which reaches each pixel towards the corresponding photosensitive area.

To achieve all or part of these objects, as well as others, an embodiment of the present invention provides an image sensor comprising a surface intended to be illuminated and pixels, each pixel comprising a photosensitive area formed in an active area of a substrate, at least one first pixel comprising a first microlens located on said surface. The sensor comprises at least one second pixel comprising a transparent portion forming a pedestal located at least partly on said surface and a second microlens at least partially covering the pedestal.

According to an embodiment, the pedestal at least partially covers the first microlens.

According to an embodiment, the second microlens completely covers the pedestal.

According to an embodiment, the second pixel is adjacent to the first pixel, the photosensitive areas of the first and second pixels being offset to the side of the common edge between the first and second pixels.

According to an embodiment, the surface area taken up by the first microlens or the second microlens is equal to the portion of said surface associated with the first microlens or with the second microlens.

According to an embodiment, the substrate is covered with a stack of insulating layers, the first microlens being located on said stack.

According to an embodiment, the image sensor comprises at least one third pixel comprising an additional transparent portion forming an additional pedestal at least partly located on said surface, thicker than the pedestal, and a third microlens covering the additional pedestal.

An embodiment of the present invention provides an optical device, especially a camera, a cell phone, or a digital photographic device, comprising an image sensor such as defined previously.

An embodiment of the present invention provides a method for forming an image sensor comprising a surface intended to be illuminated and pixels, each pixel comprising a photosensitive area formed in an active area of a substrate. The method comprises the steps of forming, for at least one first pixel, a first microlens located on said surface; covering said surface and the first microlens with a transparent layer; forming in the transparent layer, for at least one second pixel, at least one portion forming a pedestal; and forming a second microlens at least partially covering the pedestal.

The foregoing and other objects, features, and advantages of the present invention will be discussed in detail in the following non-limiting description of specific embodiments in connection with the accompanying drawings.

DETAILED DESCRIPTION

Figure 1:
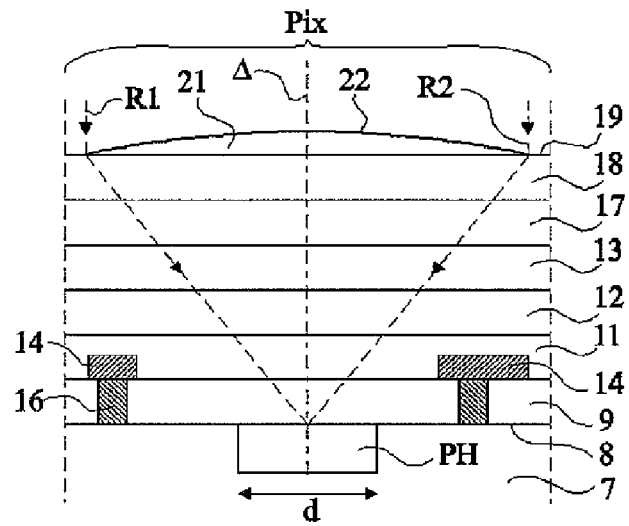
FIG. 1, previously described, is a simplified cross-section view of a conventional image sensor pixel.

For clarity, the same elements have been designated with the same reference numerals in the different drawings and, further, as usual in the representation of integrated circuits, the various drawings are not to scale.

Figure 2:
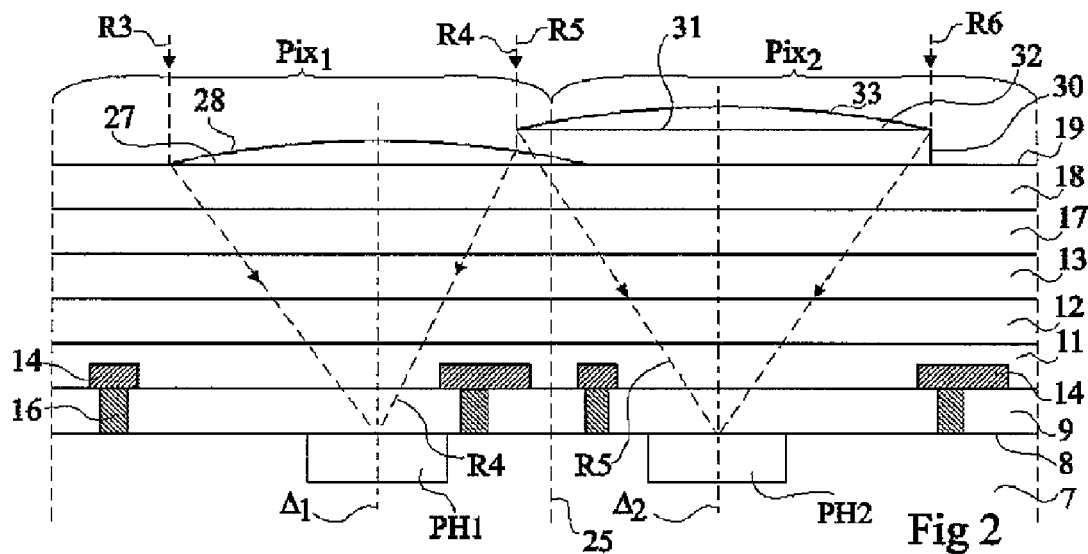
FIG. 2 is a simplified cross-section view of two adjacent pixels of an embodiment of an image sensor.

FIG. 2 is a simplified cross-section view of two adjacent pixels $Pix_1$, $Pix_2$ of an embodiment of an image sensor. Vertical dotted line 25 shows the theoretical border between the two pixels $Pix_1$, $Pix_2$. Pixels $Pix_1$, $Pix_2$ substantially have the same structure as the pixel of FIG. 1. However, for each of pixels $Pix_1$, $Pix_2$, the corresponding photosensitive area PH1, PH2 is off-centered with respect to the pixel center. As an example, photosensitive areas PH1, PH2 are shown to be offset towards the side of common border 25 between pixels $Pix_1$, $Pix_2$. Pixel $Pix_1$ comprises, on exposure surface 19, a microlens 27 having a convex surface 28. In the case where the light rays reaching microlens 27 are substantially parallel to optical axis $\Delta_1$ of microlens 27, optical axis $\Delta_1$ may be centered on photosensitive area PH1. As an example, for a pixel $Pix_1$ with a 4-µm side and for a distance on the order of from 8 to 10 µm between microlens 27 and the associated photosensitive area PH1, the maximum thickness of microlens 27 is approximately 0.5 µm. Microlens 27 may occupy, at its base, a surface area equal to, greater, or smaller than the portion of exposure surface 19 associated with pixel $Pix_1$. Thereby, microlens 27 may extend partly on the portion of exposure surface 19 associated with pixel $Pix_2$.

Pixel $Pix_2$ comprises, on exposure surface 19, a portion forming pedestal 30, for example, formed of a transparent material having the same refraction index as the material forming lens 27. Pedestal 30 partially extends on pixel $Pix_1$ while covering microlens 27. Pedestal 30 comprises a substantially planar surface 31 on the side opposite to exposure surface 19. A microlens 32 having a convex surface 33 covers pedestal 30. Microlens 32 is, for example, formed of a transparent material having the same refraction index as the material forming microlens 27. In the case where the light rays reaching microlens 32 are substantially parallel to optical axis $\Delta_2$ of microlens 32, optical axis $\Delta_2$ can be centered on photosensitive area PH2. Microlens 32 may have, at its base, substantially the same dimensions as microlens 21 of FIG. 1, that is, take up a surface area equal to or slightly smaller than the portion of exposure surface 19 associated with pixel $Pix_2$. Pedestal 30 takes up substantially the same surface area as microlens 32 and is thus completely covered by microlens 32.

In FIG. 2, light rays R3, R4 focused by microlens 27 and light rays R5, R6 focused by microlens 32 have been shown. Since the material forming pedestal 30 has the same refraction index as the material forming microlens 27, the portion of microlens 27 which extends under microlens 32 does not hinder the propagation of the light rays (ray R5) which are focused by microlens 32. Thereby, all the light rays focused by microlens 32 converge toward photosensitive area PH2. Since the base of microlens 32 can be identical to that of microlens 21, the sensitivity of pixel $Pix_2$ is identical to that of the pixel of FIG. 1.

Only the light rays which reach the portion of microlens 27 uncovered by pedestal 30 and microlens 32 are focused by microlens 27 towards photosensitive area PH1. Thereby, for microlenses 27, 32 having bases of same surface area, a smaller quantity of light rays is focused by microlens 27 with respect to microlens 32. However, the overlapping between microlenses 27, 32 being small, the decrease in sensitivity of pixel $Pix_1$ is small. As a variation, the surface area taken up by the base of microlens 27 may be larger than that of microlens 32 so that the same quantity of light rays is focused by microlenses 27 and 32.

Further, for certain applications, it may be desirable to privilege the sensitivity of some pixels over that of others. As an example, for a color image sensor for which three types of color filters which essentially transmit the light rays having wavelengths respectively corresponding to colors red, green, and blue are used, it may be desirable to privilege the pixels associated with green which is the color to which the human eye is most sensitive. In this case, pedestals 30 and microlenses 32 are formed in line with the pixels associated with color green and microlenses 27 are formed in line with the pixels associated with red and blue.

In FIG. 2, the curvatures of microlenses 27, 32 are selected to focus the light rays at the surface of photosensitive areas PH1, PH2. However, it may be desirable for the secondary focal point of microlenses 27, 32 not to be located at the level of surface 8 of substrate 7 but in depth in substrate 7. Indeed, the photon absorption depth in substrate 7 increases along with the wavelength of the incident photons. It may thus be desirable for some of microlenses 27,32, for example, the microlenses 27, 32 of the green or red color pixels, to focus the light rays in depth in substrate 7 so that the incident light rays remain generally confined across the largest possible thickness of substrate 7 under the photosensitive areas.

The present embodiment of the image sensor has been described in the case where incident light rays R3, R4, R5, and R6 are parallel to optical axes $\Delta_1$, $\Delta_2$ Of microlenses 27, 32. However, especially for the pixels located at the image sensor periphery, the incident light rays may be inclined with respect to optical axes $\Delta_1$, $\Delta_2$ Of microlenses 27, 32. Thereby, microlenses 27, 32, and pedestal 30 may be laterally shifted with respect to what is shown in FIG. 2 to properly direct the light rays towards the associated photosensitive areas PH1, PH2. For a same image sensor, the positions of microlenses 27, 32 and of pedestals 30 may thus not be identical for all pixels and depend on the considered pixel to take into account the inclination of the incident light rays, which tends to increase as it is moved away from the image sensor center.

FIGS. 3A to 3D show pixels $Pix_1$, $Pix_2$ of the sensor of FIG. 2 at different steps of an example of a method for manufacturing the image sensor.

Figure 3A:
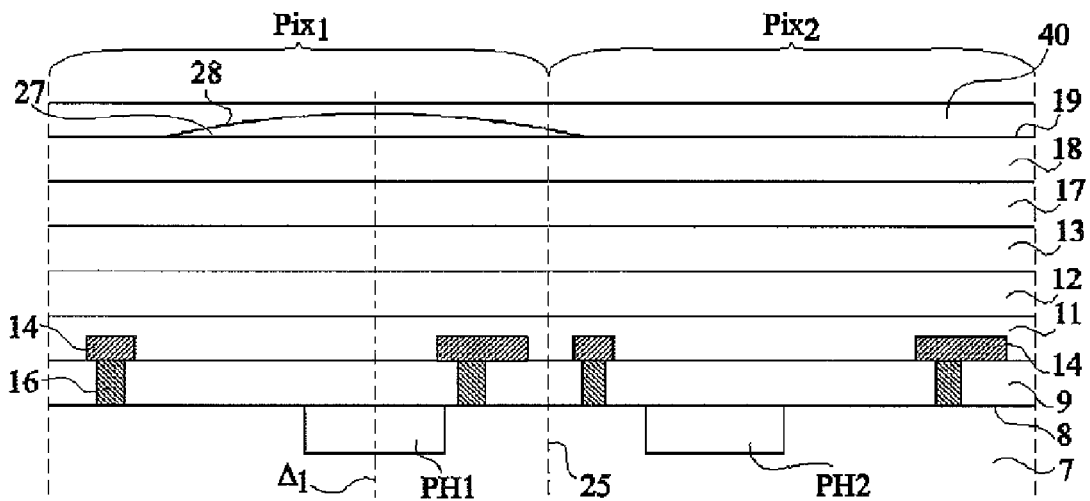
FIGS. 3A to 3D illustrate successive steps of an example of a method for manufacturing the image sensor of FIG. 2.

FIG. 3A illustrates the result of first steps of manufacturing of pixels $Pix_1$, $Pix_2$. In the case where substrate 7 is formed of P-type doped silicon, photosensitive areas PH1, PH2 are formed by N-type ion implantation. An insulating layer 9 is then deposited, in which conductive vias 16 are formed. After, conductive tracks 14 are formed before deposition of a second insulating layer 11. It is proceeded as previously to form the conductive vias and the conductive tracks associated with insulating layers 11, 12, and 13. Color filters 17 are then formed, as well as equalization layer 18. Further, a microlens 27 associated with pixel $Pix_1$ is formed conventionally, as an example, by flow and reticulation steps. Finally, a layer of a transparent material having the same refraction index as microlens 27 is deposited over the entire structure. As an example, layer 40 has a thickness from 0.4 to 0.5 micrometer for a square pixel having a side on the order of 2 micrometers. Layer 40 may be formed by depositing resin on exposure surface 19, substrate 7 being rotated around a vertical axis. The resin then spreads and forms layer 40, the final thickness of layer 40 being defined especially by the rotation speed of substrate 7.

Figure 3B:
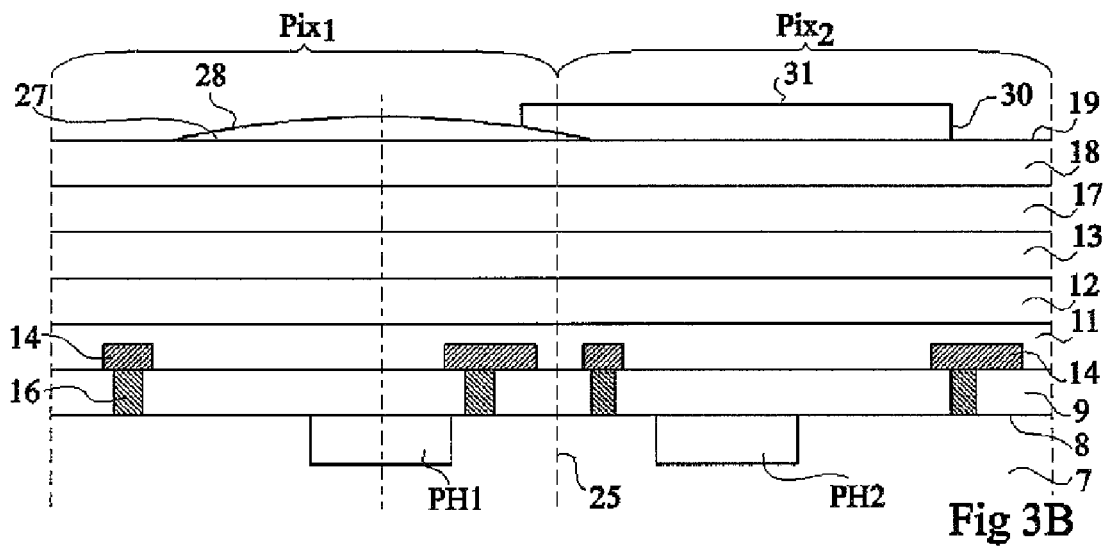

FIG. 3B illustrates the structure obtained after a step of photolithography and development of layer 40 followed by a reticulation step resulting in the forming of pedestal 30. As an example, the photolithography step comprises illuminating layer 40, for example portions which are desired to be removed (or kept according to the nature of the material forming layer 40). As an example, the development step comprises dipping the sensor in a bath to remove the portions exposed (or non-exposed) in the photolithography step. The reticulation step comprises, for example, submitting the portions of layer 40 delimited at the development step to an ultraviolet radiation for a few tens of seconds. The reticulation step results in a hardening of the portions delimited at the development step. Pedestal 30 is thus formed.

Figure 3C:
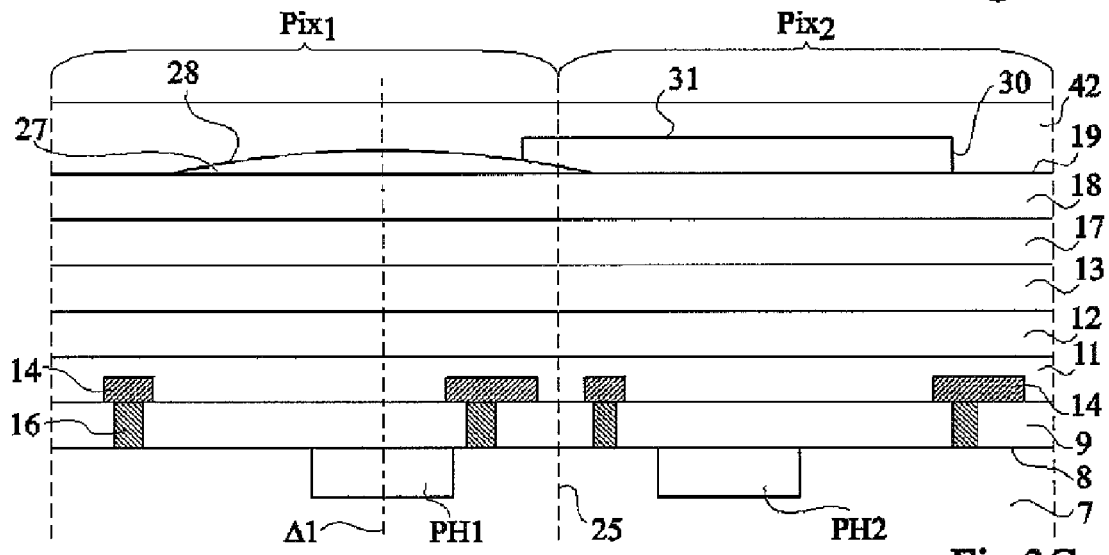

FIG. 3C shows the structure obtained after having deposited over the entire image sensor a layer 42 of a transparent resin, for example having the same refraction index as microlens 27. The deposition of layer 42 may be performed identically to the deposition of layer 40.

Figure 3D:
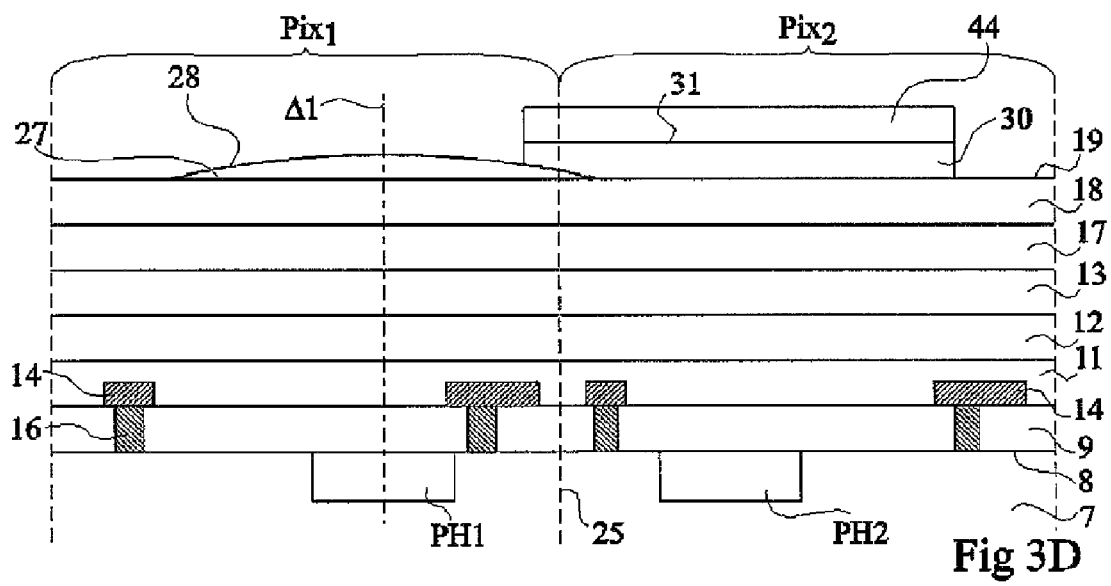

FIG. 3D shows the structure obtained after having delimited, in layer 42, a block 44 which covers pedestal 30. Block 44 may be formed by steps of photolithography and development of layer 42, as described previously for the forming of pedestal 30.

Microlens 32, shown in FIG. 2, is then formed. As an example, this may be performed by steps of flow and reticulation of block 44. The flow step comprises, for example, heating block 44 to 200° C. for a duration on the order of from 30 seconds to one minute. Block 44 flows to take the shape of the desired microlens 32. The reticulation step comprises, for example, prolonging the heating of the block having flowed or submitting the block having flowed to an ultraviolet radiation. On forming of microlens 32, microlens 32 and pedestal 30, for which the reticulation step has already been carried out, keep their shape.

Figure 4:
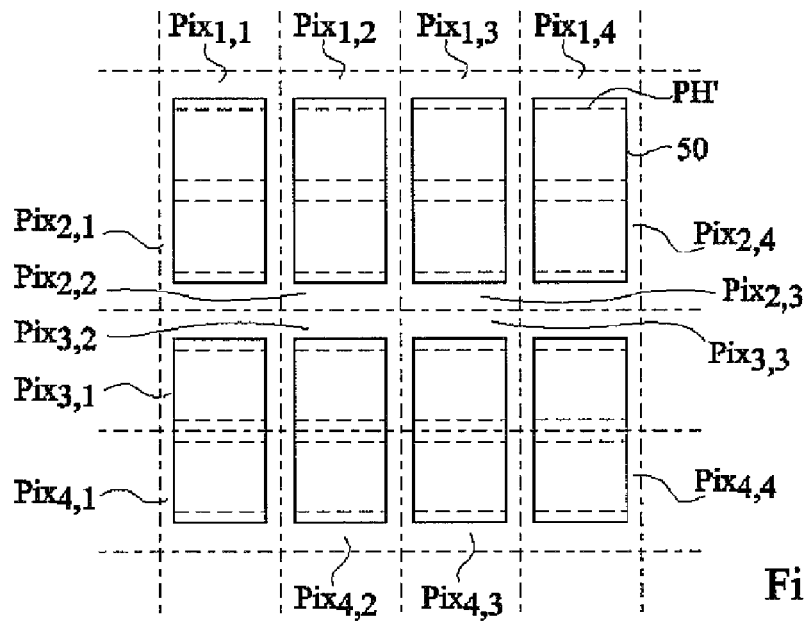
FIGS. 4 and 5 are simplified top views of a conventional image sensor and of the embodiment of the image sensor of FIG. 2.
Figure 5:
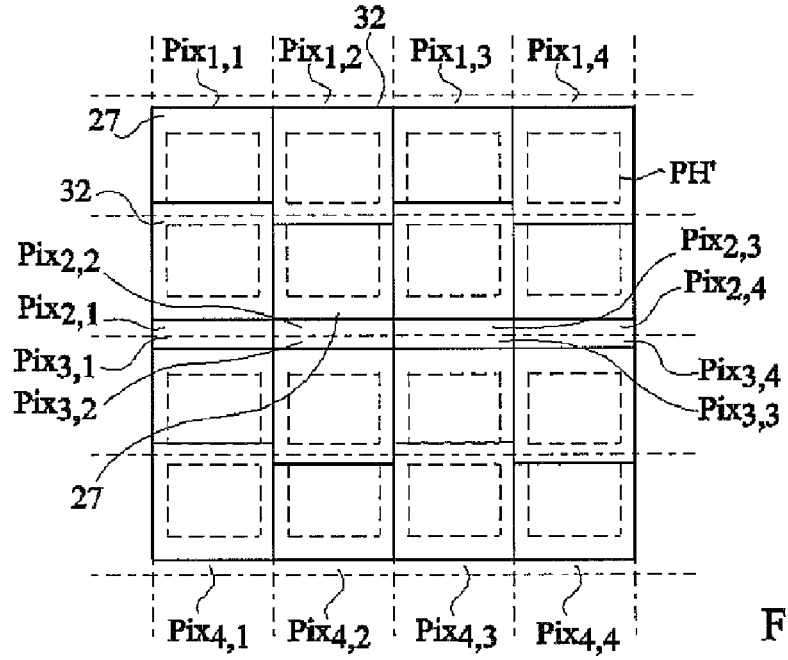

FIGS. 4 and 5 show simplified top views of image sensors comprising pixels $Pix_{i,j}$ where i and j are integers ranging between 1 and 4, with a square or rectangular base arranged in rows and in columns. Pixels $Pix_{i,j}$ are delimited by stripe-dot lines. The position of the photosensitive areas PH' associated with pixels $Pix_{i,j}$ has been shown in dotted lines. The photosensitive areas are off-centered with respect to the center of the corresponding pixels. As an example, for each pair of adjacent pixel rows, photosensitive areas PH' are brought closer to the common edge between the rows.

FIG. 4 shows the positions of conventionally-formed microlenses 50, that is, which all directly rest on the sensor exposure surface, and which are centered on the corresponding photosensitive areas. As appears in this drawing, the surface area taken up by each microlens 50 is decreased with respect to the exposure surface portion associated with each pixel, to be able to center each microlens on the associated photosensitive area PH'.

FIG. 5 shows a representation similar to FIG. 4 for the image sensor embodiment illustrated in FIG. 2. The limits of microlenses 27 and 32 have been shown in full lines. However, the portions of microlenses 27 hidden by microlenses 32 are not shown. As an example, microlenses 32 are distributed one pixel out of two per row. More specifically, for the first two rows, microlenses 32 are associated with pixels $Pix_{2,1}$, $Pix_{1,2}$, $Pix_{2,3}$, and $Pix_{1,4}$ and microlenses 27 are associated with pixels $Pix_{1,1}$, $Pix_{2,2}$, $Pix_{1,3}$, and $Pix_{2,4}$. The surface area taken up by a microlens 27, 32 is substantially equal to the portion of the exposure surface associated with a pixel. Thereby, even for microlenses 27 partially covered with microlenses 32, the amount of light focused towards the associated photosensitive areas is greater than that focused by microlenses 50 of FIG. 4.

Such an arrangement of microlenses 27 and 32 is particularly well adapted to an image sensor for which the color filters are distributed according to a Bayer pattern. For such a sensor, for each group of four adjacent pixels having a common corner, the pixels of a first pixel diagonal are provided with color filters associated with red and blue and are provided with microlenses 27 and the pixels of the second pixel diagonal are provided with color filters associated with green and are provided with microlenses 32.

According to an alternative embodiment, the material forming pedestal 30 has a refraction index which is different from the refraction index of the material forming microlens 27 and which may be identical to or different from the refraction index of the material forming microlens 32. In this case, pedestal 30 may correspond to a layer extending over the entire exposure surface 19 of the sensor (it is, for example, layer 40 shown in FIG. 3A). It may then be desirable for pedestal 30 to have a sufficient thickness for the light rays which reach microlens 32 not to reach microlens 27 (which is, for example, the case for light ray R5 in FIG. 2) and thus not to be deviated by microlens 27.

It is possible not to use the pedestals to enable partial overlapping of adjacent microlenses but only to adjust the position of the secondary focal point of the microlenses. Indeed, the forming of microlenses, especially by flow techniques, is a difficult operation. In particular, it is generally difficult to obtain very small or vary large curvature radiuses. The use of pedestals thus enables modifying the position of the secondary focal point of some microlenses with respect to the substrate surface while keeping microlenses having a curvature which is easy to obtain. For such applications, it is possible for the photosensitive areas of the pixels not to be off-centered.

Figure 6:
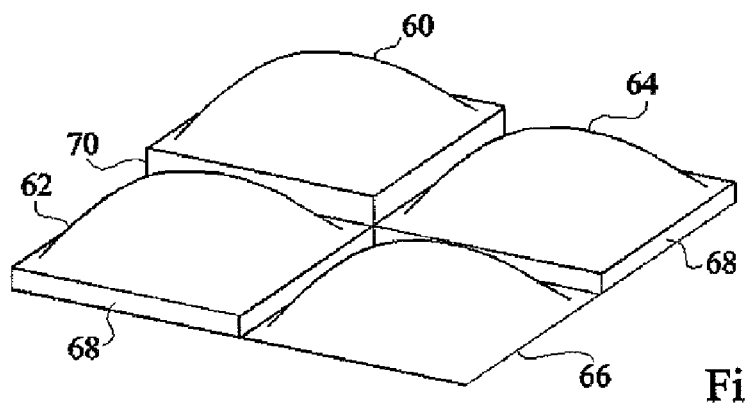
FIG. 6 is a partial simplified perspective view of another embodiment of an image sensor.

FIG. 6 shows four adjacent microlenses 60, 62, 64, and 66 of four adjacent pixels, not shown, having photosensitive areas which may not have to be off-centered. As an example, microlens 62 is formed directly on the exposure surface of the sensor, microlenses 62, 64 are formed on a pedestal 68 having the same thickness, and microlens 60 is formed on a pedestal 70 having a greater thickness than the thickness of pedestal 68. Such a configuration may be adapted to a sensor having its color filters distributed according to a Bayer pattern. In this case, microlens 60 is associated with a blue pixel, microlenses 62 and 64 are associated with green pixels and microlens 66 is associated with a red pixel. Indeed, since the absorption depth of the incident photons in a substrate increases along with the wavelength of these photons, it may be desirable to promote the focusing of blue photons at the substrate surface while green pixels are focused deeper into the substrate and red photons are focused deeper still into the substrate. This may be obtained with the distribution of pedestals 68, 70 of FIG. 6 without modifying, or only slightly modifying, the curvatures of microlenses 60, 62, 64, 66.

The pedestals may be used both to enable partial overlapping of microlenses and adjustment of the position of the secondary focal points of the microlenses.

Of course, the present invention is likely to have various alterations, modifications, and improvements which will readily occur to those skilled in the art. In particular, the previously-described embodiments have been described for sensors comprising a determined number of conductive track levels 14 and of conductive via levels 16. However, the devices may be formed with a greater or smaller number of conductive tracks 14 and of conductive via levels 16. Further, although the previously-described embodiments relate to sensors illuminated on their front surface, it should be clear that the present invention can also apply to a back-lit image sensor, the microlenses being then located at the rear surface of the substrate where the photosensitive areas are formed.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An image sensor comprising a surface to be illuminated and pixels, each pixel comprising a photosensitive area formed in an active area of a substrate, each pixel being associated with only one microlens, the microlens of at least one first pixel being located on said surface, the microlens of at least one second pixel at least partially covering a transparent portion forming a pedestal located at least partly on said surface.

2. The image sensor of claim 1, wherein the pedestal at least partially covers the microlens of a first pixel.

3. The image sensor of claim 1, wherein the microlens of a second pixel completely covers the pedestal.

4. The image sensor of claim 1, wherein the second pixel is adjacent to the first pixel, the photosensitive areas of the first and second pixels being offset to the side of the common edge between the first and second pixels.

5. The image sensor of claim 1, wherein the material of the pedestal has the same optical index as the material of the microlenses.

6. The image sensor of claim 1, wherein the substrate is covered with a stack of insulating layers, the microlens of a first pixel being located on said stack.

7. The image sensor of claim 1, comprising at least one third pixel comprising:

an additional transparent portion forming an additional pedestal at least partly located on said surface, thicker than the pedestal; and
a third microlens covering the additional pedestal.

8. An optical device comprising the image sensor of claim 1.

9. An optical device as defined in claim 8, comprising a camera, a cell phone, or a digital photographic device.

10. A method for forming an image sensor comprising a surface to be illuminated and pixels, each pixel comprising a photosensitive area formed in an active area of a substrate, comprising:

forming, for at least one first pixel, a first microlens located on said surface;
covering said surface and the first microlens with a transparent layer;
forming in the transparent layer, for at least one second pixel, at least one portion forming a pedestal; and
forming a second microlens at least partially covering the pedestal, wherein each of the first and second pixels is associated with only one microlens.

11. A method as defined in claim 10, wherein the photosensitive areas of the first and second pixels are offset with respect to centers of the respective first and second pixels.

12. A method as defined in claim 11, wherein the first and second microlenses are aligned with the offset photosensitive areas of the respective first and second pixels.

13. A method as defined in claim 12, wherein the pedestal is offset with respect to the center of the second pixel.

14. An image sensor comprising:

a substrate;
first and second pixels, each comprising a photosensitive area, formed in an active area of the substrate;
a first microlens of the first pixel located on an illumination surface of the image sensor;
a transparent pedestal located at least partially on the illumination surface; and
a second microlens of the second pixel at least partially covering the transparent pedestal, wherein each of the first and second pixels is associated with only one microlens.

15. An image sensor as defined in claim 14, wherein the transparent pedestal is offset with respect to a center of the second pixel.

16. An image sensor as defined in claim 14, wherein the second microlens completely covers the transparent pedestal.

17. An image sensor as defined in claim 14, wherein the second pixel is adjacent to the first pixel and the photosensitive areas of the first and second pixels are offset from centers of the respective pixels toward a common edge between the first and second pixels.

18. An image sensor as defined in claim 14, wherein a material of the transparent pedestal has the same optical index as a material of the first and second microlenses.

19. An image sensor as defined in claim 14, further comprising a third pixel including an additional transparent pedestal at least partially located on the illumination surface, the additional transparent pedestal being thicker than the transparent pedestal, and a third microlens covering the additional transparent pedestal.

20. An image sensor as defined in claim 14, wherein the photosensitive areas of the first and second pixels are offset with respect to centers of the respective first and second pixels.

21. An image sensor as defined in claim 20, wherein the first and second microlenses are aligned with the offset photosensitive areas of the respective first and second pixels.

22. A method for forming an image sensor, comprising:
forming first and second pixels, each comprising a photosensitive area, in an active area of a substrate;
forming a first microlens of the first pixel on an illumination surface of the image sensor;
forming a transparent pedestal at least partially on the illumination surface; and
forming a second microlens of the second pixel at least partially covering the transparent pedestal, wherein each of the first and second pixels is associated with only one microlens.

23. A method as defined in claim 22, wherein forming a transparent pedestal comprises offsetting the transparent pedestal with respect to a center of the second pixel.

24. A method as defined in claim 22, wherein the second pixel is formed adjacent to the first pixel, and the photosensitive areas of the first and second pixels are offset from centers of the respective pixels toward a common edge between the first and second pixels.

25. A method as defined in claim 22, wherein a material of the transparent pedestal has the same optical index as a material of the first and second microlenses.

26. A method as defined in claim 22, further comprising forming a third pixel, forming an additional transparent pedestal at least partly located on the illumination surface, the additional transparent pedestal being thicker than the transparent pedestal, and forming a third microlens of the third pixel covering the additional transparent pedestal.

27. A method as defined in claim 22, wherein forming first and second pixels comprises forming the photosensitive areas of the first and second pixels offset with respect to centers of the respective first and second pixels.

28. A method as defined in claim 27, wherein the first and second microlenses are aligned with the offset photosensitive areas of the respective first and second pixels.

* * * * *